(12) United States Patent
Simonin

(10) Patent No.: US 11,493,539 B2
(45) Date of Patent: Nov. 8, 2022

(54) CURRENT TRANSDUCER

(71) Applicant: LEM INTERNATIONAL SA, Plan-les-Ouates (CH)

(72) Inventor: Ludovic Simonin, Vesancy (FR)

(73) Assignee: LEM International SA, Plan-les-Ouates (CH)

( * ) Notice: Subject to any disclaimer, the term of this patent is extended or adjusted under 35 U.S.C. 154(b) by 0 days.

(21) Appl. No.: 17/761,011

(22) PCT Filed: Sep. 10, 2020

(86) PCT No.: PCT/EP2020/075415
§ 371 (c)(1),
(2) Date: Mar. 16, 2022

(87) PCT Pub. No.: WO2021/052873
PCT Pub. Date: Mar. 25, 2021

(65) Prior Publication Data
US 2022/0268817 A1    Aug. 25, 2022

(30) Foreign Application Priority Data

Sep. 21, 2019    (EP) .................................... 19198826

(51) Int. Cl.
*G01R 15/20*    (2006.01)
*H05K 1/18*    (2006.01)
*G01R 33/07*    (2006.01)

(52) U.S. Cl.
CPC ........... *G01R 15/207* (2013.01); *G01R 33/07* (2013.01); *H05K 1/181* (2013.01)

(58) Field of Classification Search
CPC ....... G01R 15/207; G01R 33/07; H05K 1/181
See application file for complete search history.

(56) References Cited

U.S. PATENT DOCUMENTS

| 6,545,456 B1 | 4/2003 | Radosevich |
| 2008/0231255 A1 | 9/2008 | Lepine |

(Continued)

OTHER PUBLICATIONS

International Search Report and Written Opinion as issued by the International Searching Authority, dated Nov. 20, 2020, for International Patent Application No. PCT/EP2020/075415; 12 pages.

*Primary Examiner* — Dominic E Hawkins
(74) *Attorney, Agent, or Firm* — Faegre Drinker Biddle & Reath LLP

(57) ABSTRACT

An open loop current transducer comprising a housing, a magnetic core comprising a pair of core parts forming a pair of magnetic field gaps therebetween, the magnetic core mounted in the housing, a pair of magnetic field detectors, one magnetic field detector being mounted in each magnetic field gap, a leadframe comprising core mounting parts and magnetic field detector contacts, and a mounting plate. The mounting plate is mounted on a top side of the magnetic core and the leadframe mounted on a bottom mounting side of the magnetic core. The mounting plate is fixed to the pair of core parts and defines the position of the magnetic core parts. The magnetic field detector contacts comprise circuit board contact portions for connection to an external circuit board, and magnetic field detector contact portions for connection to contacts of the magnetic field detectors.

9 Claims, 1 Drawing Sheet

(56) References Cited

U.S. PATENT DOCUMENTS

| | | | | |
|---|---|---|---|---|
| 2010/0097049 A1* | 4/2010 | Lepine | ............ | G01R 15/207 |
| | | | | 324/117 H |
| 2015/0084617 A1* | 3/2015 | Popovic | ............ | G01R 15/207 |
| | | | | 324/127 |
| 2015/0309082 A1* | 10/2015 | Labbe | ............ | H01F 3/14 |
| | | | | 29/605 |
| 2018/0299493 A1* | 10/2018 | Peccoux | ............ | G01R 15/202 |

* cited by examiner

CURRENT TRANSDUCER

CROSS-REFERENCE TO RELATED APPLICATIONS

The present application is a national stage entry of International (PCT) Patent Application Number PCT/EP2020/075415, filed Sep. 10, 2020, which claims priority to European Patent Application Number 19198826.0, filed Sep. 21, 2019, the complete disclosures of which are expressly incorporated herein by reference.

The present invention relates to an open loop current transducer for mounting on a circuit board.

Many conventional open loop current transducers comprise a magnetic core with an air gap in which a magnetic field detector is positioned for measuring a magnetic field induced by a primary conductor carrying a current to be measured by the magnetic core. Such open loop type of current transducers are widely used in current sensing applications in view of their durability, large current measuring range and low cost, in particular including the low cost of the electronics required to drive the current transducer circuit.

There is however an ongoing need to further increase the durability and reliability of current transducers especially for use in harsh environments, for instance for use in automotive or other mobile applications subject to mechanical vibration, mechanical shocks and large thermal variations. Often it is required to measure of currents over a large operating range. The influence of external magnetic fields on the measurement results should also be reduced. Reliability of the current measurement should also be high in many applications notwithstanding the harsh operating conditions.

In many conventional open loop transducers for a large operating range, it is typical to provide a single magnetic core comprising an airgap in which a magnetic field detector, typically a Hall effect detector, is mounted. This may however lead to saturation of the magnetic core in sections of the magnetic core that are distant from the magnetic field gap. This problem can be reduced by providing a magnetic core with two airgaps, which further provides an additional measurement signal that is redundant but that increases the measurement reliability. However, such arrangements are more costly than arrangements with a single magnetic circuit gap and moreover in conventional systems introduce additional drawbacks due to the increased number of components that need to be assembled together, the difficulty in ensuring a precise and constant magnetic field gap, and reduced robustness and durability.

In view of the foregoing, it is an object of this invention to provide a robust, durable and reliable current transducer that is also economical to produce and install.

It is advantageous to provide an open loop current transducer that has a large operating range and that is for use in harsh operating environments in particular subject to mechanical vibrations, shock and large thermal variations such as in automotive or other mobile applications.

Objects of the invention have been achieved by providing a current transducer according to claim 1.

Disclosed herein is an open loop current transducer comprising a housing, a magnetic core comprising a pair of core parts forming a pair of magnetic field gaps therebetween, the magnetic core mounted in the housing, a pair of magnetic field detectors, one magnetic field detector being mounted in each magnetic field gap, a leadframe comprising core mounting parts and magnetic field detector contacts, and a mounting plate. The mounting plate is mounted on a top side of the magnetic core and the leadframe mounted on a bottom mounting side of the magnetic core. The mounting plate is fixed to the pair of core parts and defines the position of the magnetic core parts. The magnetic field detector contacts comprise circuit board contact portions for connection to an external circuit board, and magnetic field detector contact portions for connection to contacts of the magnetic field detectors. The magnetic field detector contact portions are positioned in a magnetic field detector mounting cavity on opposed lateral sides of the housing.

In an advantageous embodiment, the magnetic field detector mounting cavity of the housing comprises an airgap portion for insertion of the magnetic field detector in the magnetic field gap, and a connection recess portion for positioning of the contacts of the magnetic field detectors therein for connection to the magnetic field detector contact portions.

In an advantageous embodiment, the core mounting parts of the leadframe comprise clamping posts upstanding from the mounting face and extending through orifices in the magnetic core parts from a mounting side to a top side and through orifices in the mounting plate configured to clamp the mounting plate, magnetic core parts and core mounting parts of the leadframe together.

In an advantageous embodiment, the mounting plate forms a closed circuit completely surrounding a central passage adapted to receive a primary conductor therethrough, the mounting plate comprising a gap bridging portion comprising a hump extending outwardly above the magnetic field gap.

In an advantageous embodiment, the mounting plate is stamped and formed from sheet metal.

In an advantageous embodiment, the magnetic core parts are identical and arranged in mirror image symmetry about a central passage configured to receive a primary conductor therethrough.

In an advantageous embodiment, the magnetic field detector contact portions comprise connection pads for solder or weld connection of the contacts of the magnetic field detectors thereto, the connection pads positioned in the connection recess portion of the housing in a manner leaving them exposed for assembly and connection of the magnetic field detectors into the housing.

In an advantageous embodiment, the housing is formed of a polymer molded over the magnetic core, leadframe and mounting plate, except for circuit board contact portions and magnetic field detector contact portions of the leadframe.

In an advantageous embodiment, the circuit board contact portions of the core mounting parts project outwardly from the housing substantially in the direction of a mounting plane for connection to an external circuit board with connection positions surrounding the outer periphery of the housing.

Further objects and advantageous features of the invention will be apparent from the claims, from the detailed description, and annexed drawings, in which:

Figure 1:
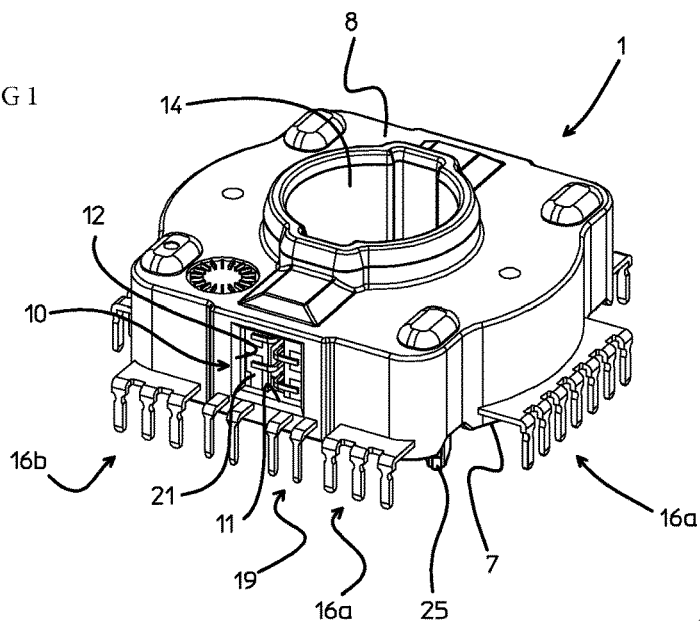
FIG. 1 is a perspective view of a current transducer according to an embodiment of the invention.
Figure 2:
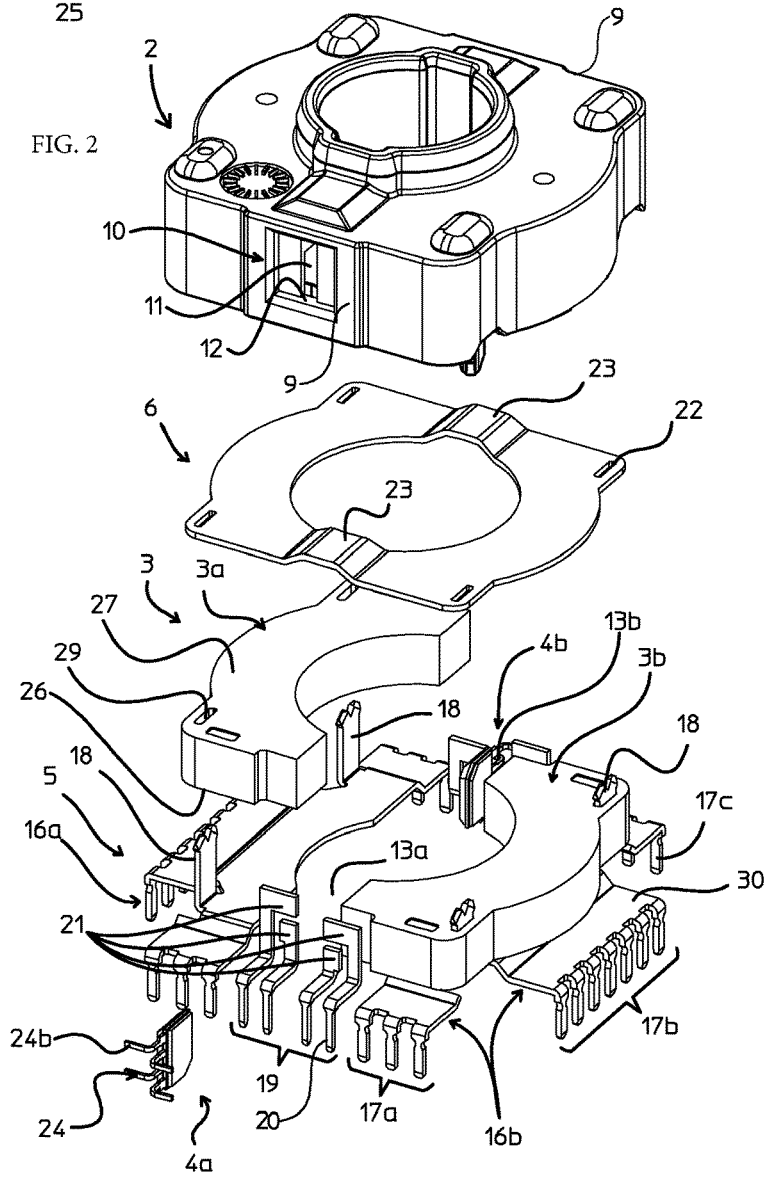
FIG. 2 is an exploded perspective view of the current transducer embodiment of FIG. 1.

Referring to the figures, a current transducer 1 according to an embodiment of the invention comprises a housing 2, a magnetic core 3 made of a soft magnetic material, mounted within the housing 2, and magnetic field detectors 4a, 4b for measuring a magnetic field generated by a primary conductor (not shown) carrying a current to be measured, the primary conductor intended to be inserted through a central passage 14 of the current transducer.

The magnetic core 3 is formed of two core parts 3a, 3b. In an advantageous embodiment, the core parts are preferably identical core parts arranged in mirror image symmetry and forming therebetween a pair of magnetic field gaps 13a, 13b. There are a corresponding pair of magnetic field detectors 4a, 4b, one positioned in each magnetic field gap 13a, 13b.

Each magnetic field detector may in particular be in the form of an application specific integrated circuit (ASIC) in an overmolded plastic housing comprising contacts 24 extending therefrom for connection to external circuitry supplying power and receiving measurement signals from the magnetic field detector. Such magnetic field detectors are per se well known. A magnetic field detector may in particular be a Hall effect detector, although within the scope of the invention other magnetic field detectors could be used.

The magnetic core parts 3a, 3b may be made of a ferrite material, or of a stack of soft iron sheets, such materials being per se well known for magnetic cores. The central passage 14 is in the illustrated embodiment a circular or substantially circular passage, however the central passage may also have other shapes such as square, rectangular, polygonal or elliptical.

The current transducer further comprises a mounting plate 6 mounted on a top side of the magnetic core 3, and a leadframe 5 mounted on a bottom or mounting side of the magnetic core 3. The leadframe 5 is formed from a sheet of metal provided in a strip, and subject to a stamping and forming operation. Such stamping and forming operations of leadframes for producing contact parts that are connected to components of a current transducer and typically overmolded by a housing portion of the current transducer are per se well known. An advantage of leadframe components is the low cost particularly in high volume manufacturing, combined with the accurate positioning of various elements of the leadframe relative to each other. The term "leadframe" as used herein is intended to cover the stamped and formed component in its finished state.

The leadframe 5 comprises core mounting parts 16a, 16b and magnetic field detector contacts 19, the magnetic field detector contacts and core mounting parts being stamped and formed out of a common strip of sheet metal, however the magnetic field detector contacts are separated from the core mounting parts 16a, 16b.

The magnetic field detector contacts 19 comprise circuit board contact portions 20 for connection to conductive circuit traces on an external circuit board (not shown) and magnetic field detector contact portions 21 for connection to the contacts 24 of the magnetic field detectors 4a, 4b.

The core mounting parts 16a, 16b comprise circuit board contact portions 17 for connection to the external circuit board (not shown) and clamping posts 18 that are upstanding from the mounting side. The clamping posts extend through orifices 29 of the magnetic core arranged proximate corners of the magnetic core. The clamping post 18 extends substantially orthogonally from a mounting face 7 of the transducer, from a mounting side 26 to a top side 27 of the magnetic core, and further extends through clamping post orifices 22 in the mounting plate 6. The clamping posts 18 are secured by a crimping operation, or alternatively by welding or soldering to the mounting plate 6, to secure the leadframe core mounting parts 16a, 16b to the magnetic core parts 3a, 3b and to the mounting plate 6.

The mounting plate 6 has a closed shape with material continuously formed around the central passage 14 such that by securing the magnetic core parts 3a, 3b via the clamping posts 18 to the mounting plate 6, the position of the magnetic core parts 3a, 3b are defined by the mounting plate 6 in a robust mechanical arrangement.

The mounting plate 6 may advantageously also be formed of a stamped and formed sheet metal part.

The mounting plate may further comprise a gap bridging portion 23 that forms a hump around the magnetic field gaps 13a, 13b. The hump 23 provides some additional mechanical rigidity as well as providing more space for insertion of the magnetic field detector 4a, 4b in the magnetic field gap 13a, 13b whereby the magnetic field detectors may have a height slightly greater than the height of the magnetic field gap.

There are at least two clamping posts 18 extending through each magnetic core part 3a, 3b although within the scope of the invention it is possible to provide three or more clamping posts and corresponding orifices for securely fixing the magnetic core, mounting plate 6, and leadframe core mounting parts 16a, 16b together.

The leadframe core mounting parts 16a, 16b also serve to secure the current transducer to an external circuit board by way of the circuit board contact portions 17 that may be soldered or welded to corresponding metallic circuit traces on the circuit board.

In the illustrated embodiment, the circuit board contact portions 17 are in the form of pin contacts intended to be inserted into corresponding orifices in the circuit board, however the contact portions may also be bent to have feet for surface mount connection to metallic pads on the circuit board, such connection techniques being per se well known.

The circuit board contact portions 17 may be arranged along a substantial length of the magnetic core on a single side thereof or on a plurality of sides 17a, 17b, 17c as shown in the illustrated embodiment. Circuit board contact portions may be formed on three sides of the magnetic core part, 17a, 17b, 17c so as to provide a particularly robust connection of the current transducer to the external circuit board.

An intermediate portion 30 of the core mounting parts 28 extends substantially parallel to the mounting plane outwardly from the magnetic core parts 3a, 3b, thus increasing the stability of the connection to the external circuit board by increasing the distance between the circuit board contact portions 17 around the central passage 14. The circuit board contact portions 17 may further be used to connect the magnetic core part 3a, 3b to an electrical ground connection.

The magnetic field detector contacts 19 have circuit board contact portions 20 that may be pin contact portions for insertion through corresponding metallic orifices in an external circuit board or for surface mount connection to circuit pads on the circuit board for connection to the electrical circuitry supplying power to the magnetic field detector and receiving the measurement signals from the magnetic field detector. In the illustrated embodiment, there are four contacts that are formed from the same sheet metal of the leadframe 5 and cut away from each other to form independent electrical contacts during the leadframe manufacturing process.

The housing 2 may advantageously be molded over portions of the leadframe 5 (except for the contact portions 17, 20), magnetic core 3 and mounting plate 6, for instance in an injection molding process.

The housing 2 comprises a mounting side 7 that may be further provided with mounting posts 25 for securing the housing to an external circuit board provided with corresponding orifices, whereby the mounting posts may be slightly longer than the contact portions 17, 20 of the leadframe so as to guide the transducer and position it with respect to the circuit board. If the contacts are in the form of surface mount contacts, then the mounting posts serve to position and orient the transducer with respect to the circuit board for aligning the contacts with the corresponding circuit traces on the circuit board.

On opposed lateral sides 9 of the housing 2, extending between the mounting side 7 and top side 8, magnetic field detector mounting cavities 10 are formed at the position of the magnetic field gaps 13a, 13b in the magnetic core 3. The magnetic field detector mounting cavities 10 each comprise an airgap portion 11 allowing insertion of the magnetic field detectors 4 into the magnetic field gaps 13a, 13b formed between the core parts 3a, 3b. The airgap portion 11 extends from a connection recess portion 12 that is recessed within the housing from an outermost face of the lateral side 9.

The magnetic field detector contact portions 21 of the magnetic field detector contacts 19 are arranged in an exposed manner in the connection recess portion 12 for connection to the contacts 24 of the magnetic field detectors 4a, 4b. In particular, the magnetic field detector contact portions 21 of the magnetic field detector contacts 19 in the illustrated embodiment are in the form of contact pads that allow bent portions 24b of the contacts 24 to be welded or soldered to the contact pads.

The housing can thus be overmolded over the magnetic core, leadframe, and mounting plate, and the magnetic field detectors can then be subsequently inserted in the magnetic field detector mounting cavity 10 of the housing 2 from opposed lateral sides 9, whereby electrical connection may be established by welding or soldering the contacts of the magnetic field detectors to the contact portions 21. This allows for particularly economical manufacturing yet a robust and durable arrangement while having two magnetic field detectors for enhanced performance and reliability.

In a variant, although the magnetic field detector contact portions 21 of the magnetic field detector contacts 19 are shown as substantially planar surfaces that are vertically arranged, they could also comprise non planar shapes for crimping or clamping to the contacts of the magnetic field detectors. In a variant such crimping or clamping contacts could further be welded or soldered if needed to increase durability.

LIST OF REFERENCES USED

Current transducer 1
housing 2
  mounting side 7
    mounting posts 25
  top side 8
  lateral sides 9
    magnetic field detector mounting cavity 10
      airgap portion 11
      connection recess portion 12
magnetic core 3
  core parts 3a, 3b
  magnetic field gaps 13a, 13b
  central passage 14
  mounting side 26
  top side 27
  clamping post orifice 29
magnetic field detectors 4a, 4b
  ASICs
  bent contacts 24
leadframe 5
  core mounting parts 16a, 16b
    circuit board contact portions 17
    intermediate portion 30
    clamping posts 18
  magnetic field detector contacts 19
    circuit board contact portions 20
    magnetic field detector contact portions 21
      solder/weld connection pads
mounting plate 6
  clamping post orifice 22
  gap bridging portion 23
mounting plane M
lateral face plane P

The invention claimed is:

1. An open loop current transducer comprising a housing, a magnetic core comprising a pair of core parts forming a pair of magnetic field gaps therebetween, the magnetic core mounted in the housing, a pair of magnetic field detectors, one magnetic field detector being mounted in each magnetic field gap, a leadframe comprising core mounting parts and magnetic field detector contacts, and a mounting plate, the mounting plate mounted on a top side of the magnetic core and the mounted on a bottom mounting side of the magnetic core, the mounting plate fixed to the pair of core parts and defining the position of the magnetic core parts, wherein the magnetic field detector contacts comprise circuit board contact portions for connection to an external circuit board, and magnetic field detector contact portions for connection to contacts of the magnetic field detectors, the magnetic field detector contact portions positioned in a magnetic field detector mounting cavity on opposed lateral sides of the housing.

2. The current transducer according to claim 1, wherein the magnetic field detector mounting cavity of the housing comprises an airgap portion for insertion of the magnetic field detector in the magnetic field gap, and a connection recess portion for positioning of the contacts of the magnetic field detectors therein for connection to the magnetic field detector contact portions.

3. The current transducer according to claim 1, wherein the core mounting parts of the leadframe comprise clamping posts upstanding from the mounting face and extending through orifices in the magnetic core parts from a mounting side to a top side and through orifices in the mounting plate configured to clamp the mounting plate, magnetic core parts and core mounting parts of the leadframe together.

4. The current transducer according to claim 1, wherein the mounting plate forms a closed circuit completely surrounding a central passage adapted to receive a primary conductor therethrough, the mounting plate comprising a gap bridging portion comprising a hump extending outwardly above the magnetic field gap.

5. The current transducer according to claim 1, wherein the mounting plate is stamped and formed from sheet metal.

6. The current transducer according to claim 1, wherein the magnetic core parts are identical and arranged in mirror image symmetry about a central passage configured to receive a primary conductor therethrough.

7. The current transducer according to claim 1, wherein the magnetic field detector contact portions comprise connection pads for solder or weld connection of the contacts of the magnetic field detectors thereto, the connection pads positioned in the connection recess portion of the housing in a manner leaving them exposed for assembly and connection of the magnetic field detectors into the housing.

8. The current transducer according to claim 1, wherein the housing is formed of a polymer molded over the magnetic core, leadframe and mounting plate, except for circuit board contact portions and magnetic field detector contact portions of the leadframe.

9. The current transducer according to claim 8, wherein the circuit board contact portions of the core mounting parts project outwardly from the housing substantially in the direction of a mounting plane for connection to an external circuit board with connection positions surrounding the outer periphery of the housing.

\* \* \* \* \*